United States Patent
Yamamoto et al.

(10) Patent No.: US 8,536,655 B2
(45) Date of Patent: Sep. 17, 2013

(54) SEMICONDUCTOR DEVICE WITH POWER ELEMENT AND CIRCUIT ELEMENT FORMED WITHIN THE SAME SEMICONDUCTOR SUBSTRATE

(75) Inventors: Koji Yamamoto, Chiyoda-ku (JP); Atsunobu Kawamoto, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/534,695

(22) Filed: Jun. 27, 2012

(65) Prior Publication Data

US 2013/0106499 A1     May 2, 2013

(30) Foreign Application Priority Data

Oct. 26, 2011 (JP) .................................. 2011-234814

(51) Int. Cl.
  *H01L 29/76*     (2006.01)
(52) U.S. Cl.
  USPC ...... 257/378; 257/341; 257/577; 257/E27.06; 257/E27.022
(58) Field of Classification Search
  USPC ................... 257/378, 341–351, 577
  See application file for complete search history.

(56) References Cited

U.S. PATENT DOCUMENTS

| | | | | |
|---|---|---|---|---|
| 8,102,025 B2* | 1/2012 | Ozeki et al. | .................... | 257/577 |
| 8,324,691 B2* | 12/2012 | Hirose et al. | .................. | 257/378 |
| 8,390,069 B2* | 3/2013 | Kusunoki | ..................... | 257/360 |
| 2002/0000609 A1 | 1/2002 | Yasuda | | |
| 2006/0086999 A1 | 4/2006 | Shirokoshi | | |

FOREIGN PATENT DOCUMENTS

| | | |
|---|---|---|
| JP | 6-350032 | 12/1994 |
| JP | 2002-16254 | 1/2002 |
| JP | 2006-156959 | 6/2006 |

* cited by examiner

*Primary Examiner* — Thanh Nguyen
(74) *Attorney, Agent, or Firm* — Oblon, Spivak, McClelland, Maier & Neustadt, L.L.P.

(57) ABSTRACT

Even in the case where negative current flows in a semiconductor device, the potential of a semiconductor substrate is prevented from becoming lower than the potential of a deep semiconductor layer which is a component of a circuit element, and a parasitic element is prevented from operating, which accordingly prevents malfunction of the semiconductor device. The semiconductor device includes the n-type semiconductor substrate, a power element, the circuit element, and an external circuit. The external circuit includes a power supply, a resistive element having one end connected to the power supply, and a diode having its anode electrode connected to the other end of the resistive element and its cathode electrode connected to the ground. To the other end of the resistive element, a semiconductor layer is connected.

8 Claims, 6 Drawing Sheets

SEMICONDUCTOR DEVICE WITH POWER ELEMENT AND CIRCUIT ELEMENT FORMED WITHIN THE SAME SEMICONDUCTOR SUBSTRATE

BACKGROUND OF THE INVENTION

1. Field of the Invention

The present invention relates to a power semiconductor device, and particularly to a semiconductor device with a power element and a circuit element formed within the same semiconductor substrate.

2. Description of the Background Art

Recently, a structure of a power semiconductor device has been developed in which a power element supplying electric power to a connected load and a circuit element controlling the power element are formed in the same semiconductor substrate. During a normal operation of the semiconductor device having the power element and the circuit element formed in the same semiconductor substrate, the potential of the semiconductor substrate does not become lower than the potential of a deep semiconductor layer of the p type (GND) which is a component of the circuit element. Therefore, during a normal operation, a parasitic element (parasitic NPN transistor) formed between the semiconductor substrate and an NMOS (N-channel Metal-Oxide-Semiconductor) which is a component of the circuit element does not operate and thus the semiconductor device does not malfunction.

However, in the case where negative current flows in the semiconductor device, the potential of the semiconductor substrate becomes lower than the potential of the deep p-type semiconductor layer which is a component of the circuit element. Accordingly, parasitic current flows from the p-type semiconductor layer to the semiconductor substrate, which causes the parasitic element to operate. As the parasitic element operates, the semiconductor device could malfunction.

Japanese Patent Laying-Open Nos. 2006-156959 and 06-350032 each disclose a configuration that does not allow a parasitic element formed in a semiconductor device to operate, and thus prevents the semiconductor device from malfunctioning.

In the semiconductor device disclosed in Japanese Patent Laying-Open No. 2006-156959, a first dummy region is formed between a power element's transistor and a circuit element and a second dummy region is formed between the transistor and an end of a semiconductor substrate, in order to prevent a parasitic element from operating. The first and second dummy regions are of a conductivity type different from that of the semiconductor substrate. The second dummy region is connected to a part of the semiconductor substrate that is located between the transistor and the first dummy region.

Further, in the semiconductor device disclosed in Japanese Patent Laying-Open No. 06-350032, an element isolation region and a GND line of an internal circuit are not directly connected by an interconnect layer which extends from a GND pad but connected through a resistive element, in order not to allow a parasitic element to operate.

In a semiconductor device having a power element and a circuit element formed in the same semiconductor substrate, a parasitic element is formed between the semiconductor substrate and an NMOS which is a component of the circuit element. When negative current flows in this semiconductor device, the potential of the semiconductor substrate becomes lower than the potential of a deep semiconductor layer of the p type which is a component of the circuit element, which causes the parasitic element to operate and thus causes malfunction of the semiconductor device.

SUMMARY OF THE INVENTION

The present invention prevents, even when negative current flows in the semiconductor device, the potential of the semiconductor substrate from becoming lower than the potential of the deep semiconductor layer which is a component of the circuit element, and thus does not allow the parasitic element to operate, to thereby prevent malfunction of the semiconductor device.

According to an aspect of the present invention, a semiconductor device includes a semiconductor substrate of a first conductivity type, a power element, a circuit element, a first semiconductor layer, and an external circuit. The power element is formed in one surface of the semiconductor substrate and supplies electric power to a connected load. The circuit element is formed in the one surface of the semiconductor substrate in which the power element is formed, and includes at least one MOS transistor having a source-drain region of the first conductivity type. The first semiconductor layer is of a second conductivity type, formed in the one surface of the semiconductor substrate in which the power element is formed, and arranged independently of the power element and the circuit element. The external circuit is electrically connected to the semiconductor substrate and the first semiconductor layer. The external circuit includes a first power supply, a first resistive element having one end connected to the first power supply, and a first diode having an anode electrode connected to the other end of the first resistive element and a cathode electrode connected to a ground. The first semiconductor layer is connected to the other end of the first resistive element.

In the semiconductor device according to the present invention, even when negative current flows in the semiconductor device, the potential of the semiconductor substrate is prevented from becoming lower than the potential of the deep semiconductor layer which is a component of the circuit element and thus the parasitic element is not allowed to operate. Accordingly, malfunction of the semiconductor device is prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, embodiments of the present invention will be described with reference to the drawings.

First Embodiment

Figure 1:
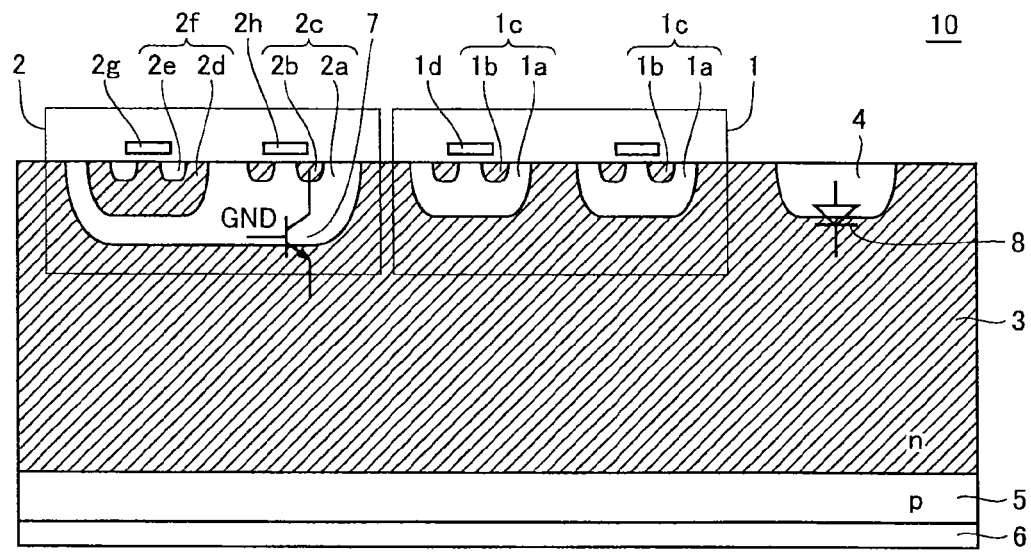
FIG. 1 is a schematic diagram showing a configuration of a semiconductor device according to a first embodiment of the present invention.

FIG. 1 is a schematic diagram showing a configuration of a semiconductor device according to a first embodiment of the present invention. Semiconductor device 10 shown in FIG. 1 is a power semiconductor device, and includes a power element 1 supplying electric power to a connected load and a circuit element 2 controlling power element 1, and power element 1 and circuit element 2 are formed in the same semiconductor substrate 3. Further, semiconductor substrate 3 has one surface in which power element 1 is formed, and a p-type semiconductor layer 4 arranged independently of power element 1 and circuit element 2 is formed in this one surface of the substrate.

Semiconductor substrate 3 is an n-type silicon substrate and has the one surface in which power element 1 and circuit element 2 are formed. Semiconductor substrate 3 has an opposite surface located opposite to the one surface in which power element 1 and circuit element 2 are formed. On this opposite surface of the substrate, a p-type semiconductor layer 5 and a back electrode 6 are stacked.

In power element 1, a MOS transistor 1c having an n-type source-drain region 1b is formed in a p-type semiconductor layer 1a.

In circuit element 2, a MOS transistor 2c having an n-type source-drain region 2b is formed in a p-type semiconductor layer 2a. Here, p-type semiconductor layer 2a is formed deeper than p-type semiconductor layer 1a. Further, in semiconductor substrate 3, an n-type semiconductor layer 2d is formed in p-type semiconductor layer 2a and, in the formed semiconductor layer 2d, a MOS transistor 2f having a p-type source-drain region 2e is formed. Between p-type source-drain regions 2e, a gate electrode 2g is formed. Likewise, between n-type source-drain regions 1b and between n-type source-drain regions 2b, gate electrodes 1d and 2h are formed, respectively.

The configuration of power element 1 and circuit element 2 shown in FIG. 1 is provided by way of illustration, and is not limited to MOS transistors 1c, 2c, 2f, namely elements of another configuration may also be formed. It should be noted, however, that circuit element 2 includes at least one MOS transistor 2c. Therefore, in circuit element 2, a parasitic element is formed between MOS transistor 2c and semiconductor substrate 3. Specifically, a parasitic NPN transistor constituted of n-type source-drain region 2b, p-type semiconductor layer 2a, and n-type semiconductor substrate 3 is formed in semiconductor substrate 3.

Since p-type semiconductor layer 4 is formed in n-type semiconductor substrate 3, a pn-junction diode 8 is formed.

Figure 2:
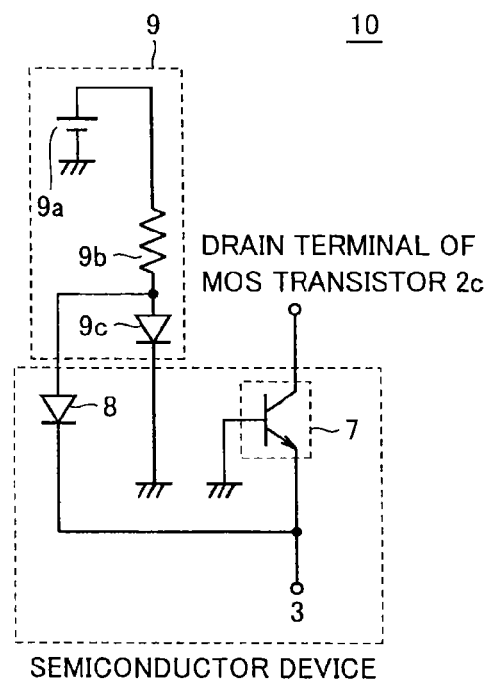
FIG. 2 is a circuit diagram showing a circuit configuration of the semiconductor device according to the first embodiment of the present invention.

Semiconductor device 10 also includes an external circuit (not shown in FIG. 1) connected to semiconductor substrate 3 and semiconductor layer 4. An equivalent circuit of semiconductor device 10 including the external circuit will be described. FIG. 2 is a circuit diagram showing a circuit configuration of semiconductor device 10 according to the first embodiment of the present invention.

External circuit 9 shown in FIG. 2 includes a power supply 9a, a resistive element 9b having one end connected to power supply 9a, and a diode 9c having an anode electrode connected to the other end of resistive element 9b and a cathode electrode connected to the ground GND. The other end of resistive element 9b is also connected electrically to an anode electrode (semiconductor layer 4) of diode 8.

In semiconductor device 10 shown in FIG. 2, resistive element 9b and diode 9c are connected in series with power supply 9a. Thus, the potential of the anode electrode of diode 9c is approximately 0.7 V (normal temperature) corresponding to a forward voltage drop VF of diode 9c for example. In this way, the potential of semiconductor layer 4 is fixed to appropriately 0.7 V and the potential of semiconductor substrate 3 is set to approximately 0 V which is lower by approximately 0.7 V than the potential of semiconductor layer 4.

During an ON state of power element 1 caused by a normal operation, the potential of semiconductor substrate 3 of semiconductor device 10 is a collector-emitter saturation voltage VCE (saturation) of power element 1. During an OFF state of power element 1 caused by a normal operation, the potential of back electrode 6 of semiconductor device 10 is higher than the potential of semiconductor substrate 3, and therefore the potential of semiconductor substrate 3 will not become a negative potential.

In the case where negative current flows in semiconductor device 10, however, the potential of semiconductor substrate 3 becomes a negative potential. In the case where negative current flows and the potential of semiconductor substrate 3 becomes a negative potential in a conventional semiconductor device which does not include external circuit 9, the potential of semiconductor substrate 3 becomes lower than the potential of semiconductor layer 2a, which causes parasitic NPN transistor 7 to be turned on, causes parasitic current to flow from semiconductor layer 2a to semiconductor substrate 3, and causes parasitic NPN transistor 7 to operate.

In contrast, even when negative current flows in semiconductor device 10, diode 9c can be used to fix the potential of semiconductor layer 4 to approximately 0.7 V. Therefore, the potential of semiconductor substrate 3 will not become a negative potential and can be kept at approximately 0 V. Thus, in semiconductor device 10, the potential of semiconductor layer 2a and the potential of semiconductor substrate 3 can be made approximately identical to each other, parasitic NPN transistor 7 is not turned on, and no parasitic current flows from semiconductor layer 2a to semiconductor substrate 3. Parasitic NPN transistor 7 therefore does not operate.

As seen from the foregoing, in semiconductor device 10 according to the first embodiment of the present invention, diode 9c can be used to fix the potential of semiconductor layer 4 to approximately 0.7 V. Therefore, even when negative current flows, the potential of semiconductor substrate 3 is prevented from becoming lower than the potential of p-type semiconductor layer 2a which is a component of the circuit element, which prevents parasitic NPN transistor 7 from operating and prevents semiconductor device 10 from malfunctioning. It is noted that malfunction of semiconductor device 10 is prevented and accordingly degradation of the characteristics of the semiconductor device due to malfunction can be suppressed. Therefore, the semiconductor device can be used for a longer period of time.

Second Embodiment

As for semiconductor device 10 of the first embodiment, when negative current flows in semiconductor device 10, the current is conducted in the forward direction of diode 8 formed in semiconductor layer 4 and thus the current flowing in diode 8 increases. As the current flowing in diode 8 increases, a voltage drop due to resistive element 9b causes the potential of the anode electrode of diode 9c (potential of semiconductor layer 4) to decrease.

As the voltage drop due to resistive element 9b causes the potential of the anode electrode of diode 9c to become equal to or lower than a forward voltage drop VF (0.7 V for example) of diode 9c, diode 9c becomes an OFF state and thus the current is not conducted. As the current is not conducted in the forward direction of diode 9c, the potential of semiconductor layer 4 cannot be fixed.

Further, if the voltage drop due to resistive element 9b increases to cause the potential of the anode electrode of diode 9c to become 0 V or less, the potential of semiconductor substrate 3 accordingly decreases by 0.7 V or more relative to the potential of semiconductor layer 2a. Accordingly, parasitic NPN transistor 7 operates. Namely, the increased voltage drop due to resistive element 9b could cause semiconductor device 10 to malfunction.

Figure 3:
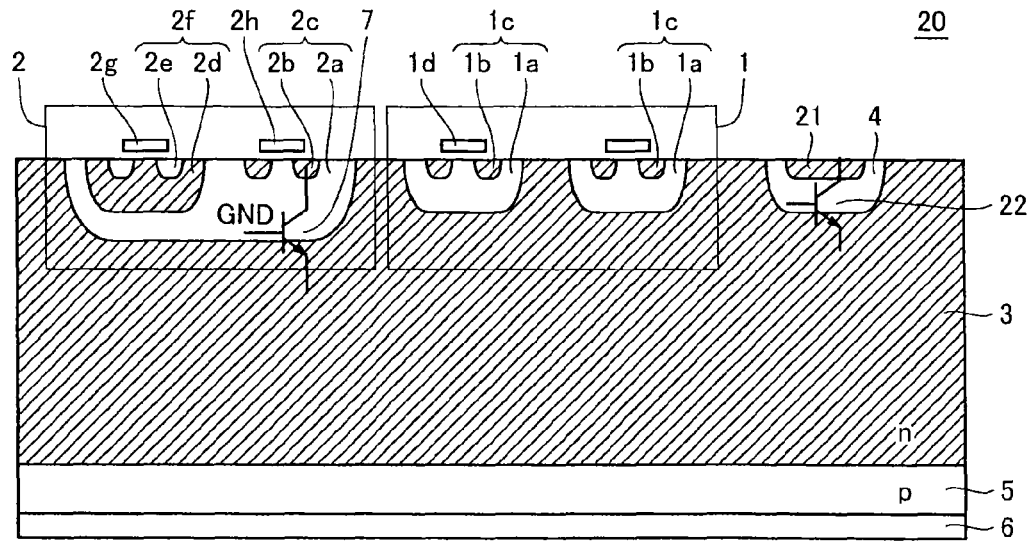
FIG. 3 is a schematic diagram showing a configuration of a semiconductor device according to a second embodiment of the present invention.

In view of this, in a semiconductor device according to a second embodiment of the present invention, a transistor is formed in semiconductor layer 4 instead of diode 8 which is formed in semiconductor layer 4. FIG. 3 is a schematic diagram showing a configuration of the semiconductor device according to the second embodiment of the present invention. Semiconductor device 20 shown in FIG. 3 is a power semiconductor device and includes power element 1 supplying electric power to a connected load and circuit element 2 controlling power element 1, and power element 1 and circuit element 2 are formed in the same semiconductor substrate 3. Further, semiconductor substrate 3 has one surface in which power element 1 is formed and, in this one surface of the substrate, p-type semiconductor layer 4 arranged independently of power element 1 and circuit element 2 is formed. Semiconductor device 20 also has an n-type semiconductor layer 21 formed in semiconductor layer 4.

Regarding semiconductor device 20 according to the second embodiment of the present invention, the same component as that of semiconductor device 10 in the first embodiment is denoted by the same reference character, and the detailed description thereof will not be repeated.

Since n-type semiconductor layer 21 is formed in p-type semiconductor layer 4, an NPN transistor 22 constituted of n-type semiconductor layer 21, p-type semiconductor layer 4, and n-type semiconductor substrate 3 is formed.

Figure 4:
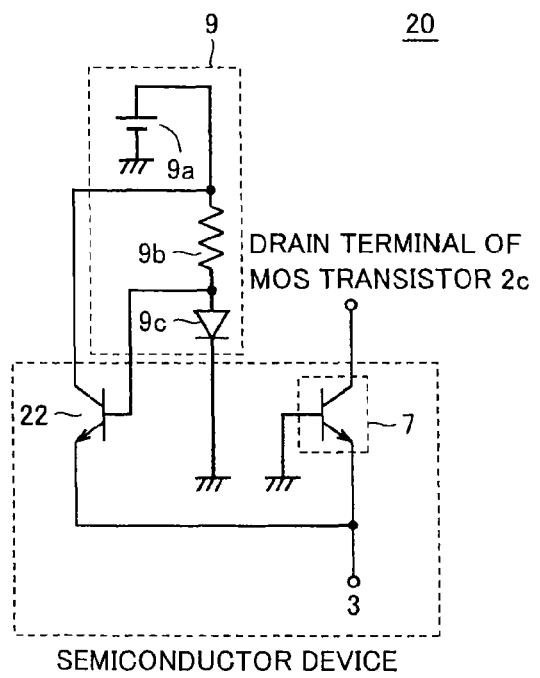
FIG. 4 is a circuit diagram showing a circuit configuration of the semiconductor device according to the second embodiment of the present invention.

Semiconductor device 20 also includes an external circuit (not shown in FIG. 3) connected to semiconductor substrate 3 and semiconductor layer 4. An equivalent circuit of semiconductor device 20 including the external circuit will be described. FIG. 4 is a circuit diagram showing a circuit configuration of semiconductor device 20 according to the second embodiment of the present invention.

External circuit 9 shown in FIG. 4 includes power supply 9a, resistive element 9b having one end connected to power supply 9a, and diode 9c having an anode electrode connected to the other end of resistive element 9b and a cathode electrode connected to the ground GND. The one end of resistive element 9b is also connected electrically to the collector electrode (semiconductor layer 21) of NPN transistor 22, and the other end of resistive element 9b is also connected electrically to the base electrode (semiconductor layer 4) of NPN transistor 22.

In semiconductor device 20 shown in FIG. 4, resistive element 9b and diode 9c are connected in series with power supply 9a to thereby set the potential of the anode electrode of diode 9c to approximately 0.7 V (normal temperature) for example. In this way, the potential of semiconductor layer 4 is fixed to approximately 0.7 V and the potential of semiconductor substrate 3 is set to approximately 0 V which is lower by approximately 0.7 V than the potential of semiconductor layer 4.

During an ON state of power element 1 caused by a normal operation, the potential of semiconductor substrate 3 of semiconductor device 20 is a collector-emitter saturation voltage VCE (saturation) of power element 1. During an OFF state of power element 1 caused by a normal operation, the potential of back electrode 6 of semiconductor device 20 is higher than the potential of semiconductor substrate 3, and therefore, the potential of semiconductor substrate 3 will not become a negative potential.

Even if negative current flows in semiconductor device 20, diode 9c can be used to fix the potential of semiconductor layer 4 to approximately 0.7 V. Therefore, the potential of semiconductor substrate 3 will not become a negative potential and can be kept at approximately 0 V. Accordingly, in semiconductor device 20, the potential of semiconductor layer 2a and the potential of semiconductor substrate 3 can be made approximately identical to each other, parasitic NPN transistor 7 does not become an ON state, and no parasitic current flows from semiconductor layer 2a to semiconductor substrate 3. Thus, parasitic NPN transistor 7 does not operate.

Further, in semiconductor device 20, n-type semiconductor layer 21 is formed in p-type semiconductor layer 4 and accordingly NPN transistor 22 is formed therein. Thus, the current flowing to resistive element 9b can be reduced and the voltage drop across resistive element 9b can be reduced. Therefore, even when negative current flows in semiconductor device 20, the collector current up to DC-current-amplification-factor (hFE) times the collector current of diode 8 of semiconductor device 10 can be flown in NPN transistor 22. Operation of parasitic NPN transistor 7 can thus be prevented.

As seen from the foregoing, in semiconductor device 20 according to the second embodiment of the present invention, NPN transistor 22 is used instead of diode 8 of semiconductor device 10. Thus, the voltage drop due to resistive element 9b is reduced and parasitic NPN transistor 7 is prevented from operating, and accordingly malfunction of semiconductor device 20 is more reliably prevented.

Third Embodiment

Figure 5A:
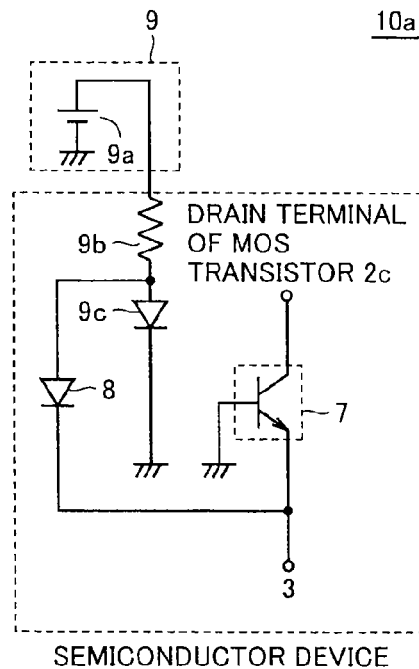
FIGS. 5A and 5B are each a circuit diagram showing a circuit configuration of a semiconductor device according to a third embodiment of the present invention.
Figure 5B:
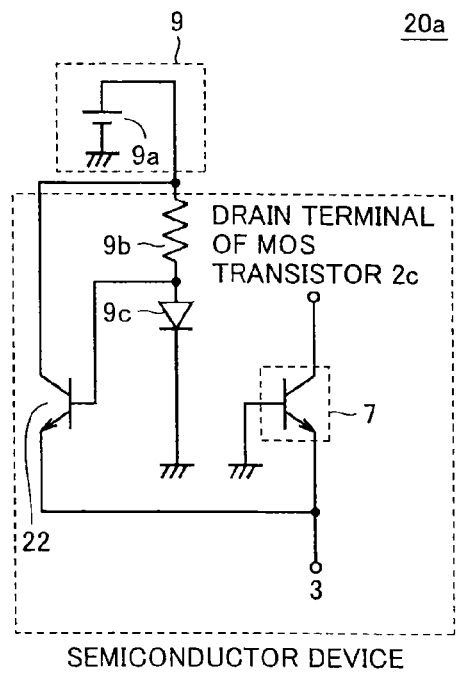

A description will be given of the case where a part of the components of external circuit 9 is formed in semiconductor substrate 3. FIGS. 5A and 5B are each a circuit diagram showing a circuit configuration of a semiconductor device according to a third embodiment of the present invention. In semiconductor device 10a shown in FIG. 5A, a part of the components of external circuit 9 of semiconductor device 10 shown in FIG. 2 is formed in semiconductor substrate 3. Specifically, resistive element 9b and diode 9c of semiconductor device 10a are formed in semiconductor substrate 3. Resistive element 9b is produced by forming a polysilicon film in semiconductor substrate 3, and diode 9c is produced by diffusing the impurity implanted in semiconductor substrate 3.

Likewise, in semiconductor device 20a shown in FIG. 5B, a part of the components of external circuit 9 of semiconductor device 20 shown in FIG. 4 is formed in semiconductor substrate 3. Specifically, resistive element 9b and diode 9c of semiconductor device 20a are formed in semiconductor substrate 3.

Regarding semiconductor devices 10a, 20a according to the third embodiment of the present invention, the same components as those of semiconductor device 10 of the first embodiment and semiconductor device 20 of the second embodiment are each denoted by the same reference character, and the detailed description thereof will not be repeated.

As seen from the foregoing, in semiconductor devices 10a, 20a according to the third embodiment of the present invention, a part of the components of external circuit 9 is formed in semiconductor substrate 3, and thus the size, the length of the interconnection, and the cost of external circuit 9 can be reduced.

Regarding semiconductor devices 10a, 20a according to the third embodiment of the present invention, the description has been given of the case where resistive element 9b and diode 9c are formed in semiconductor substrate 3. The present invention, however, is not limited to this, and at least one of resistive element 9b and diode 9c may be formed in semiconductor substrate 3.

Fourth Embodiment

Figure 6:
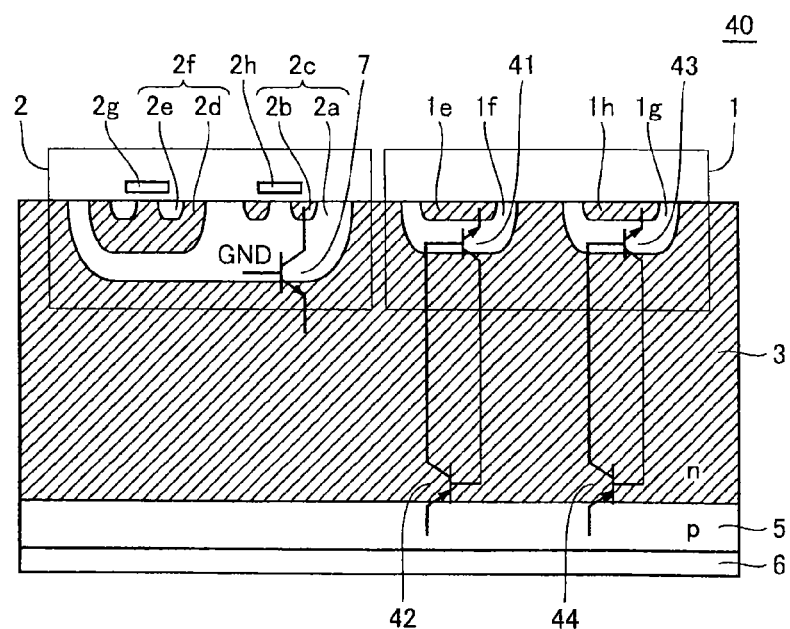
FIG. 6 is a schematic diagram showing a configuration of a semiconductor device according to a fourth embodiment of the present invention.

FIG. 6 is a schematic diagram showing a configuration of a semiconductor device according to a fourth embodiment of the present invention. Semiconductor device 40 shown in FIG. 6 is a power semiconductor device, and includes power element 1 supplying electric power to a connected load and circuit element 2 controlling power element 1, and power element 1 and circuit element 2 are formed in the same semiconductor substrate 3.

Regarding semiconductor device 40 according to the fourth embodiment of the present invention, the same component as that of semiconductor device 10 in the first embodiment is denoted by the same reference character, and the detailed description thereof will not be repeated.

Power element 1 includes a p-type semiconductor layer 1f and an n-type semiconductor layer 1e formed in p-type semiconductor layer 1f. Therefore, in power element 1, an NPN transistor 41 constituted of n-type semiconductor layer 1e, p-type semiconductor layer 1f, and n-type semiconductor substrate 3 is formed. Further, a PNP transistor 42 constituted of p-type semiconductor layer 1f, n-type semiconductor substrate 3, and p-type semiconductor layer 5 is formed in semiconductor substrate 3. Likewise, in power element 1, an n-type semiconductor layer 1h is formed in a p-type semiconductor layer 1g. Therefore, in power element 1, an NPN transistor 43 constituted of n-type semiconductor layer 1h, p-type semiconductor layer 1g, and n-type semiconductor substrate 3 is formed. Further, a PNP transistor 44 constituted of p-type semiconductor layer 1g, n-type semiconductor substrate 3, and p-type semiconductor layer 5 is formed in semiconductor substrate 3. The collector electrode of NPN transistor 41 and the collector electrode of NPN transistor 43 are electrically connected through p-type semiconductor layer 5.

It is noted that, in power element 1, MOS transistor 1c (not shown) having n-type source-drain region 1b as shown in FIG. 1 is formed.

Figure 7:
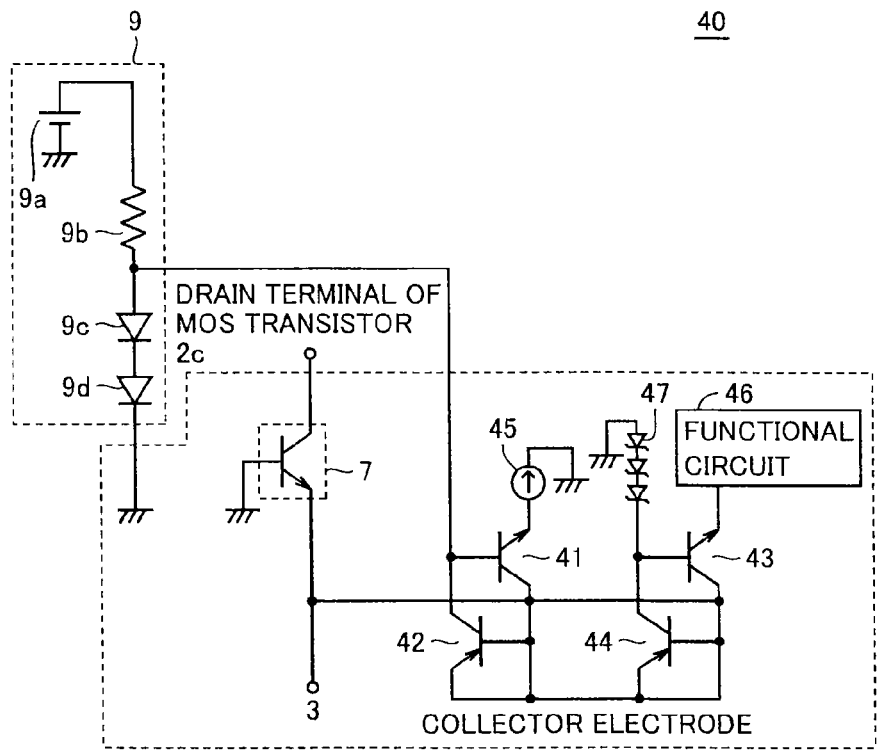
FIG. 7 is a circuit diagram showing a circuit configuration of the semiconductor device according to the fourth embodiment of the present invention.

Semiconductor device 40 includes an external circuit (not shown in FIG. 6) connected to semiconductor substrate 3 and semiconductor layer 1f. An equivalent circuit of semiconductor device 40 including the external circuit will be described. FIG. 7 is a circuit diagram showing a circuit configuration of semiconductor device 40 according to the fourth embodiment of the present invention.

External circuit 9 shown in FIG. 7 includes power supply 9a, resistive element 9b having one end connected to power supply 9a, diode 9c having an anode electrode connected to the other end of resistive element 9b, and a diode 9d having an anode electrode connected to the cathode electrode of diode 9c and a cathode electrode connected to the ground GND. The other end of resistive element 9b is also connected electrically to the base electrode (semiconductor layer 1f) of NPN transistor 41.

In semiconductor device 40 shown in FIG. 7, resistive element 9b and diodes 9c, 9d are connected in series with power supply 9a, and thus the potential of the anode electrode of diode 9c is approximately 1.4 V (normal temperature) corresponding to the sum of respective forward voltage drops VF of diodes 9c, 9d for example. Accordingly, a voltage of approximately 1.4 V is applied to the base electrode of NPN transistor 41, and current can be drawn from semiconductor substrate 3 by a current source 45 connected to the emitter electrode. As current is drawn from semiconductor substrate 3 by NPN transistor 41, a part of the hall current injected to semiconductor substrate 3 flows to the base electrode of NPN transistor 43, which causes NPN transistor 43 to operate.

As NPN transistor 43 operates, the voltage which is output from the emitter electrode of NPN transistor 43 is almost equal to the voltage of the collector electrode of NPN transistor 43. Therefore, a functional circuit 46 detecting the voltage of the output terminal for example may be provided on the emitter electrode of NPN transistor 43 to enable semiconductor device 40 to have a protection-against-overvoltage capability by which a signal proportional to the voltage of the output terminal is taken to control the overvoltage. The base electrode of NPN transistor 43 is connected to the ground GND through a plurality of zener diodes 47.

In the case where negative current flows in semiconductor device 40, the potential of semiconductor substrate 3 is kept, by means of the pn junction formed by the base electrode (p-type semiconductor layer 1f) of NPN transistor 41 and n-type semiconductor substrate 3, at a potential that is lower by approximately 0.7 V (normal temperature) relative to the potential (approximately 1.4 V (normal temperature)) of the base electrode of NPN transistor 41. Therefore, in semiconductor device 40, p-type semiconductor layer 2a and n-type semiconductor substrate 3 are reverse-biased and no parasitic current flows from semiconductor layer 2a to semiconductor substrate 3. Thus, parasitic NPN transistor 7 does not operate.

As seen from the foregoing, in semiconductor device 40 according to the fourth embodiment of the present invention, power element 1 is provided with NPN transistor 41 and NPN transistor 43 and accordingly, even when negative current flows, the potential of semiconductor substrate 3 is prevented from becoming lower than the potential of p-type semiconductor layer 2a which is a component of the circuit element and thus parasitic NPN transistor 7 is prevented from operating. Accordingly, malfunction of semiconductor device 40 is prevented.

While semiconductor device 40 according to the fourth embodiment of the present invention includes NPN transistor 41 and NPN transistor 43 that are provided in power element 1, the present invention is not limited to this and they may be provided in any component other than power element 1 and circuit element 2.

Further, it is desirable, for obtaining required performance, that NPN transistor 41 and NPN transistor 43 are formed in a separate manufacturing step from the manufacturing steps of power element 1 and circuit element 2. As long as adequate performance is obtained, however, NPN transistor 41 and NPN transistor 43 may be formed in the same manufacturing step as that of power element 1 or circuit element 2. Further, NPN transistor 41 and NPN transistor 43 are formed in power element 1 so that these transistors can be formed in the same manufacturing step as that of other components of power element 1. The manufacturing cost can thus be reduced.

Furthermore, while NPN transistor 41 uses current source 45 connected to its emitter electrode to draw current from semiconductor substrate 3, a resistive element instead of current source 45 may be connected to the emitter electrode to draw current from semiconductor substrate 3. As compared with the size of the circuit configuration in which the resistive element is connected to the emitter electrode of NPN transistor 41, the size of the circuit configuration can be reduced by connecting current source 45 to the emitter electrode of NPN transistor 41.

Moreover, a plurality of zener diodes 47 may be formed in the form of poly zener diodes on semiconductor substrate 3. Likewise, the resistive element connected to the emitter electrode of NPN transistor 41 instead of current source 45 may be formed in the form of a polysilicon resistor on semiconductor substrate 3.

Fifth Embodiment

Figure 8:
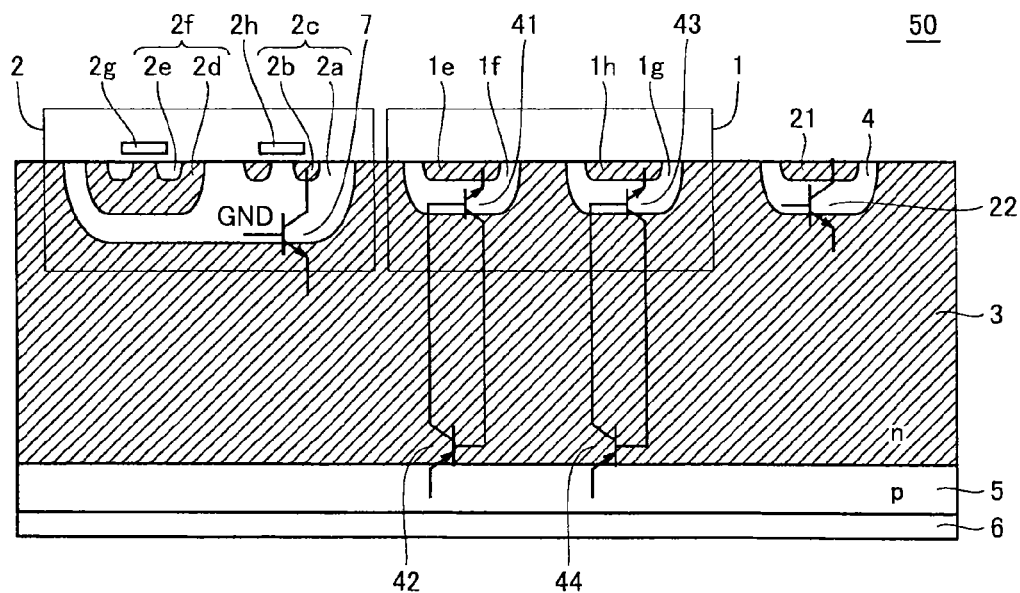
FIG. 8 is a schematic diagram showing a configuration of a semiconductor device according to a fifth embodiment of the present invention.

FIG. 8 is a schematic diagram showing a configuration of a semiconductor device according to a fifth embodiment of the present invention. Semiconductor device 50 shown in FIG. 8 is a power semiconductor device and includes power element 1 supplying electric power to a connected load and circuit element 2 controlling power element 1, and power element 1 and circuit element 2 are formed in the same semiconductor substrate 3. Further, semiconductor substrate 3 has one surface in which power element 1 is formed, and p-type semiconductor layer 4 arranged independently of power element 1 and circuit element 2 is formed in this one surface of the substrate. Semiconductor device 50 also has n-type semiconductor layer 21 formed in semiconductor layer 4.

Regarding semiconductor device 50 according to the fifth embodiment of the present invention, the same component as that of semiconductor device 20 in the second embodiment and semiconductor device 40 in the fourth embodiment is denoted by the same reference character, and the detailed description thereof will not be repeated.

Similarly to semiconductor device 40 shown in FIG. 6, power element 1 includes NPN transistors 41, 43 and PNP transistors 42, 44. In power element 1, MOS transistor 1c (not shown) having n-type source-drain region 1b is formed in p-type semiconductor layer 1a as shown in FIG. 1.

Further, like semiconductor device 20 shown in FIG. 3, n-type semiconductor layer 21 is formed in p-type semiconductor layer 4, and therefore, NPN transistor 22 constituted of n-type semiconductor layer 21, p-type semiconductor layer 4, and n-type semiconductor substrate 3 is formed in semiconductor substrate 3.

Figure 9:
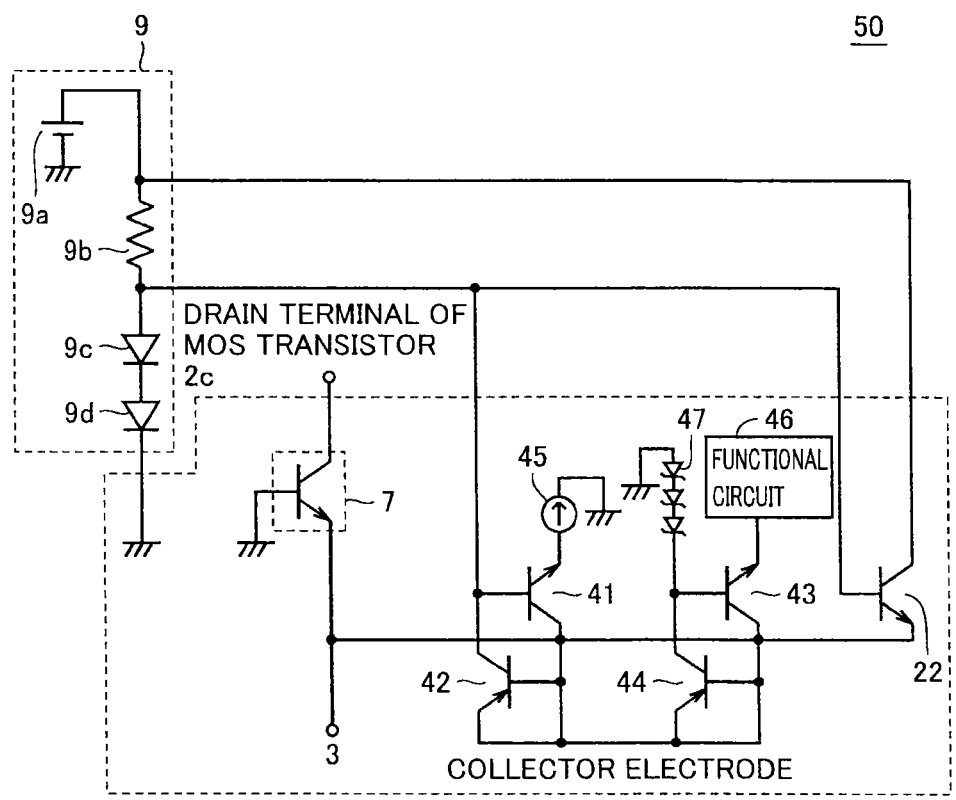
FIG. 9 is a circuit diagram showing a circuit configuration of the semiconductor device according to the fifth embodiment of the present invention.

Semiconductor device 50 also includes an external circuit (not shown in FIG. 8) connected to semiconductor substrate 3 and semiconductor layers 1f, 4. An equivalent circuit of semiconductor device 50 including the external circuit will be described. FIG. 9 is a circuit diagram showing a circuit configuration of semiconductor device 50 according to the fifth embodiment of the present invention.

External circuit 9 shown in FIG. 9 includes power supply 9a, resistive element 9b having one end connected to power supply 9a, diode 9c having its anode electrode connected to the other end of resistive element 9b, and diode 9d having its anode electrode connected to the cathode electrode of diode 9c and its cathode electrode connected to the ground GND. The other end of resistive element 9b is also connected electrically to the base electrode (semiconductor layer 1f) of NPN transistor 41. Further, the one end of resistive element 9b is electrically connected to the collector electrode (semiconductor layer 21) of NPN transistor 22, and the other end of resistive element 9b is electrically connected to the base electrode (semiconductor layer 4) of NPN transistor 22.

In the case where negative current flows in semiconductor device 40 of the fourth embodiment and the current flowing in resistive element 9b increases, a voltage drop due to resistive element 9b causes the potential of the anode electrode of diode 9c, namely the base electrode of NPN transistor 41, to decrease.

As the potential of the base electrode of NPN transistor 41 decreases, the potential of semiconductor substrate 3 decreases relative to the potential of semiconductor layer 2a, and thus parasitic NPN transistor 7 operates. Namely, an increased voltage drop due to resistive element 9b could cause semiconductor device 40 to malfunction.

In view of this, in semiconductor device 50, n-type semiconductor layer 21 is formed in p-type semiconductor layer 4 and thus NPN transistor 22 is formed. Accordingly, the current flowing to resistive element 9b can be reduced and the voltage drop across resistive element 9b can be reduced. Therefore, even when negative current flows in semiconductor device 50, the voltage drop across resistive element 9b can be reduced and parasitic NPN transistor 7 can be prevented from operating, as compared with the case where the configuration of semiconductor device 40 in the fourth embodiment is used.

As seen from the foregoing, semiconductor device 50 according to the fifth embodiment of the present invention is provided with NPN transistor 22 in addition to the components of semiconductor device 40. Therefore, the voltage drop due to resistive element 9b can be reduced and parasitic NPN transistor 7 can be prevented from operating. Thus, malfunction of semiconductor device 50 is more reliably prevented.

Sixth Embodiment

Figure 10:
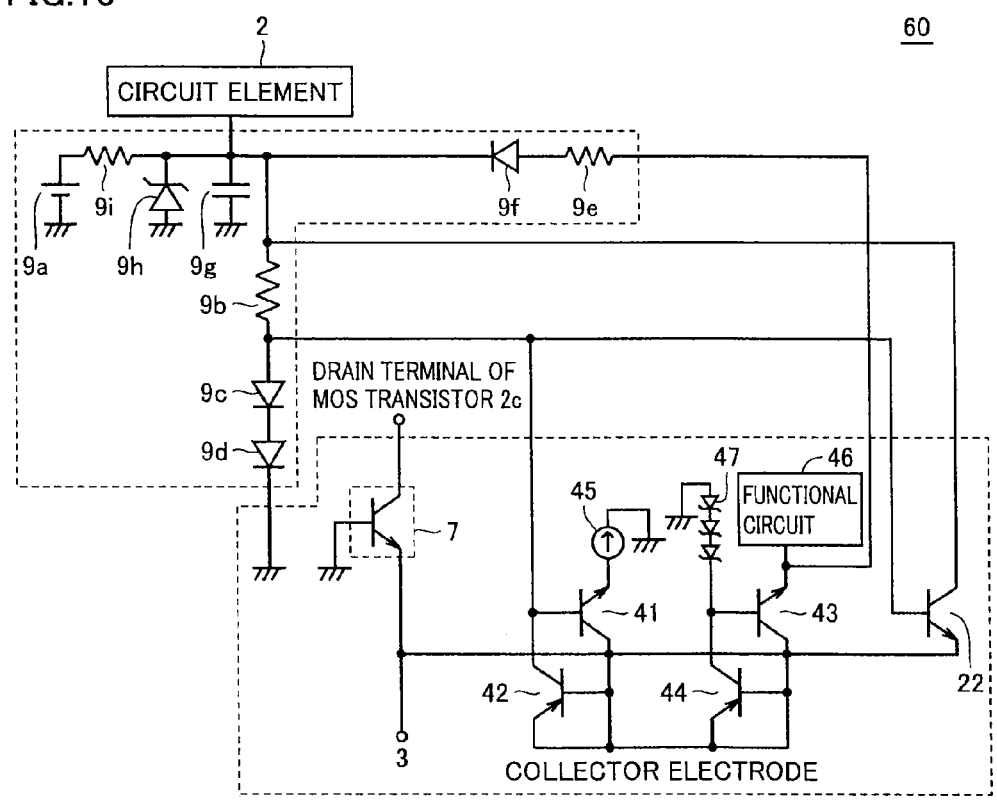
FIG. 10 is a circuit diagram showing a circuit configuration of a semiconductor device according to a sixth embodiment of the present invention.

FIG. 10 is a circuit diagram showing a circuit configuration of a semiconductor device 60 according to a sixth embodiment of the present invention. Semiconductor device 60 shown in FIG. 10 is identical in configuration to semiconductor device 50 of the fifth embodiment except for external circuit 9. Therefore, the same component as that of semiconductor device 50 is denoted by the same reference character, and the detailed description thereof will not be repeated.

External circuit 9 shown in FIG. 10 includes power supply 9a, resistive element 9b having one end connected to power supply 9a, diode 9c having its anode electrode connected to the other end of resistive element 9b, and diode 9d having its anode electrode connected to the cathode electrode of diode 9c and its cathode electrode connected to the ground GND. Further, external circuit 9 includes a resistive element 9e having one end connected to the emitter electrode of NPN transistor 43, and a diode 9f having its anode electrode connected to the other end of resistive element 9e and its cathode electrode connected to the one end of resistive element 9b. Furthermore, external circuit 9 includes a capacitive element 9g connected in parallel with power supply 9a, a zener diode 9h connected in parallel with capacitive element 9g, and a resistive element 9i connected between power supply 9a and zener diode 9h.

The other end of resistive element 9b is electrically connected to the base electrode (semiconductor layer 1f) of NPN transistor 41. Further, the one end of resistive element 9b is electrically connected to the collector electrode (semiconductor layer 21) of NPN transistor 22, and the other end of resistive element 9b is electrically connected to the base electrode (semiconductor layer 4) of NPN transistor 22.

In semiconductor device 60, resistive element 9e connected to the emitter electrode of NPN transistor 43 limits the current flowing in diode 9f. Zener diode 9h clamps the voltage (14 V for example) of power supply 9a at approximately 7 V for example.

In the case where the potential of the emitter electrode of NPN transistor 43 is higher than the capacitor potential of capacitive element 9g, capacitive element 9g is charged and the charge with which capacitive element 9g is charged can also be used as a power source for circuit element 2 including components such as control circuit. It should be noted that the capacitor voltage of capacitive element 9g only increases up to approximately 7 V since it is clamped by zener diode 9h, and backflow of the capacitor current of capacitive element 9g toward power supply 9a does not occur.

As seen from the foregoing, since semiconductor device 60 utilizes the charge with which capacitive element 9g is charged, the electric power consumed by resistive element 9i located in the vicinity of power supply 9a can be reduced and the power consumption of the whole circuit can be reduced.

It should be noted that even if negative current flows in semiconductor device 60, the presence of diode 9f prevents current from flowing to the emitter electrode of NPN transistor 43. Further, the operation of NPN transistor 22 reduces the voltage drop due to resistive element 9b and prevents parasitic NPN transistor 7 from operating, to thereby prevent malfunction of semiconductor device 60.

Further, resistive elements 9b, 9e, 9i may be formed as polysilicon resistors on semiconductor substrate 3. Likewise, diodes 9c, 9d, 9f may be formed as diffusion diodes on semiconductor substrate 3. Further, on semiconductor substrate 3, capacitive element 9g may be formed as a capacitor using a silicon substrate and polysilicon. Likewise, zener diode 9h may be formed as a poly zener diode on semiconductor substrate 3.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
a semiconductor substrate of a first conductivity type;
a power element formed in one surface of said semiconductor substrate and supplying electric power to a connected load;
a circuit element formed in said one surface of said semiconductor substrate in which said power element is formed, and including at least one MOS transistor having a source-drain region of the first conductivity type;
a first semiconductor layer of a second conductivity type formed in said one surface of said semiconductor substrate in which said power element is formed, and arranged independently of said power element and said circuit element; and
an external circuit electrically connected to said semiconductor substrate and said first semiconductor layer,
said external circuit including a first power supply, a first resistive element having one end connected to said first power supply, and a first diode having an anode electrode connected to the other end of said first resistive element and a cathode electrode connected to a ground, and
said first semiconductor layer being connected to said other end of said first resistive element.

2. The semiconductor device according to claim 1, further comprising a second semiconductor layer of the first conductivity type formed in said first semiconductor layer, wherein
said second semiconductor layer, said first semiconductor layer, and said semiconductor substrate constitute a first transistor, and
said second semiconductor layer is connected to said one end of said first resistive element, and said first semiconductor layer is connected to said other end of said first resistive element.

3. The semiconductor device according to claim 1, wherein at least one of said first resistive element and said first diode of said external circuit is formed in said semiconductor substrate.

4. The semiconductor device according to claim 2, further comprising:
a third semiconductor layer of the second conductivity type formed in said one surface of said semiconductor substrate in which said power element is formed, and arranged independently of at least said circuit element and said first semiconductor layer; and
a fourth semiconductor layer of the first conductivity type formed in said third semiconductor layer, wherein
said fourth semiconductor layer, said third semiconductor layer, and said semiconductor substrate constitute a second transistor,
respective collector electrodes of said first transistor and said second transistor are connected through said semiconductor substrate, and
a base electrode of said first transistor is connected to said other end of said first resistive element, and a second power supply or a second resistive element is connected to an emitter electrode of said first transistor.

5. The semiconductor device according to claim 4, further comprising:
a fifth semiconductor layer of the second conductivity type formed in said one surface of said semiconductor substrate in which said power element is formed, and arranged independently of at least said circuit element, said first semiconductor layer, and said third semiconductor layer; and
a sixth semiconductor layer of the first conductivity type formed in said fifth semiconductor layer, wherein
said sixth semiconductor layer, said fifth semiconductor layer, and said semiconductor substrate constitute a third transistor, and
a collector electrode of said third transistor is connected to said one end of said first resistive element, and a base electrode of said third transistor is connected to said other end of said first resistive element.

6. The semiconductor device according to claim 5, further comprising:
a third resistive element having one end connected to an emitter electrode of said second transistor;

a second diode having an anode electrode connected to the other end of said third resistive element and a cathode electrode connected to said one end of said first resistive element;
a capacitive element connected in parallel with said first power supply;
a third diode connected in parallel with said capacitive element; and
a fourth resistive element connected between said third diode and said first power supply.

7. The semiconductor device according to claim 4, wherein said first transistor and said second transistor are formed in said power element.

8. The semiconductor device according to claim 6, wherein at least one of said second resistive element, said third resistive element, said second diode, said third diode, and said capacitive element is formed in said semiconductor substrate.

* * * * *